United States Patent
Dodge et al.

(10) Patent No.: US 8,431,922 B2
(45) Date of Patent: *Apr. 30, 2013

(54) LATERAL PHASE CHANGE MEMORY

(75) Inventors: Richard Dodge, Santa Clara, CA (US); Guy Wicker, Southfield, MI (US)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

This patent is subject to a terminal disclaimer.

(21) Appl. No.: 13/485,665

(22) Filed: May 31, 2012

(65) Prior Publication Data

US 2012/0241704 A1    Sep. 27, 2012

Related U.S. Application Data

(60) Continuation of application No. 12/883,086, filed on Sep. 15, 2010, now Pat. No. 8,211,742, which is a division of application No. 11/399,297, filed on Apr. 6, 2006, now Pat. No. 7,816,660.

(30) Foreign Application Priority Data

Apr. 8, 2005 (EP) ..................................... 05102814

(51) Int. Cl.
    *H01L 45/00* (2006.01)
(52) U.S. Cl.
    USPC .... 257/4; 257/5; 257/E27.004; 257/E45.002; 365/100; 365/148
(58) Field of Classification Search .................. 257/4, 5, 257/E27.004, E45.002; 365/100, 103, 148, 365/174, 175
    See application file for complete search history.

(56) References Cited

U.S. PATENT DOCUMENTS

| | | | |
|---|---|---|---|
| 3,619,732 A | 11/1971 | Neale | 317/234 R |
| 4,115,872 A | 9/1978 | Bluhm | 365/163 |
| 4,203,123 A | 5/1980 | Shanks | 357/2 |
| 5,166,758 A | 11/1992 | Ovshinsky et al. | 257/3 |
| 6,605,821 B1 * | 8/2003 | Lee et al. | 257/4 |
| 6,744,088 B1 | 6/2004 | Dennison | 257/296 |
| 6,773,967 B1 | 8/2004 | Liu | 438/131 |
| 6,940,085 B2 * | 9/2005 | Fricke et al. | 257/4 |
| 7,135,696 B2 * | 11/2006 | Karpov et al. | 257/5 |
| 7,696,077 B2 | 4/2010 | Liu | 438/597 |
| 2003/0001230 A1 | 1/2003 | Lowrey | 257/529 |
| 2003/0116794 A1 | 6/2003 | Lowrey | 257/296 |
| 2004/0113181 A1 | 6/2004 | Wicker | 257/246 |
| 2004/0113232 A1 | 6/2004 | Johnson et al. | 257/529 |

(Continued)

FOREIGN PATENT DOCUMENTS

| EP | 1 339 110 A1 | 8/2003 |
|---|---|---|
| WO | WO 00/57498 | 9/2000 |

*Primary Examiner* — Telly Green
*Assistant Examiner* — Toniae Thomas
(74) *Attorney, Agent, or Firm* — Seed IP Law Group PLLC

(57) ABSTRACT

A lateral phase change memory includes a pair of electrodes separated by an insulating layer. The first electrode is formed in an opening in an insulating layer and is cup-shaped. The first electrode is covered by the insulating layer which is, in turn, covered by the second electrode. As a result, the spacing between the electrodes may be very precisely controlled and limited to very small dimensions. The electrodes are advantageously formed of the same material, prior to formation of the phase change material region.

18 Claims, 18 Drawing Sheets

U.S. PATENT DOCUMENTS

| | | | |
|---|---|---|---|
| 2004/0165422 A1 | 8/2004 | Hideki et al. | 365/163 |
| 2004/0197947 A1* | 10/2004 | Fricke et al. | 438/102 |
| 2004/0245603 A1* | 12/2004 | Lowrey et al. | 257/536 |
| 2005/0032319 A1* | 2/2005 | Dodge | 438/293 |
| 2006/0024950 A1* | 2/2006 | Choi et al. | 438/626 |
| 2006/0056234 A1* | 3/2006 | Lowrey | 365/163 |
| 2006/0073631 A1* | 4/2006 | Karpov et al. | 438/102 |

* cited by examiner

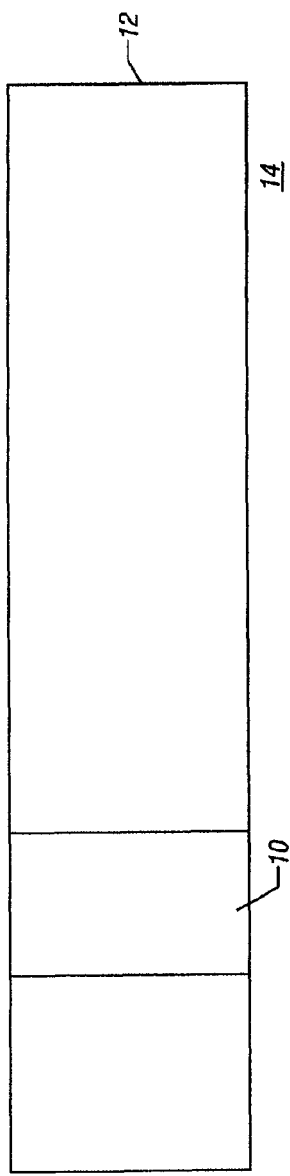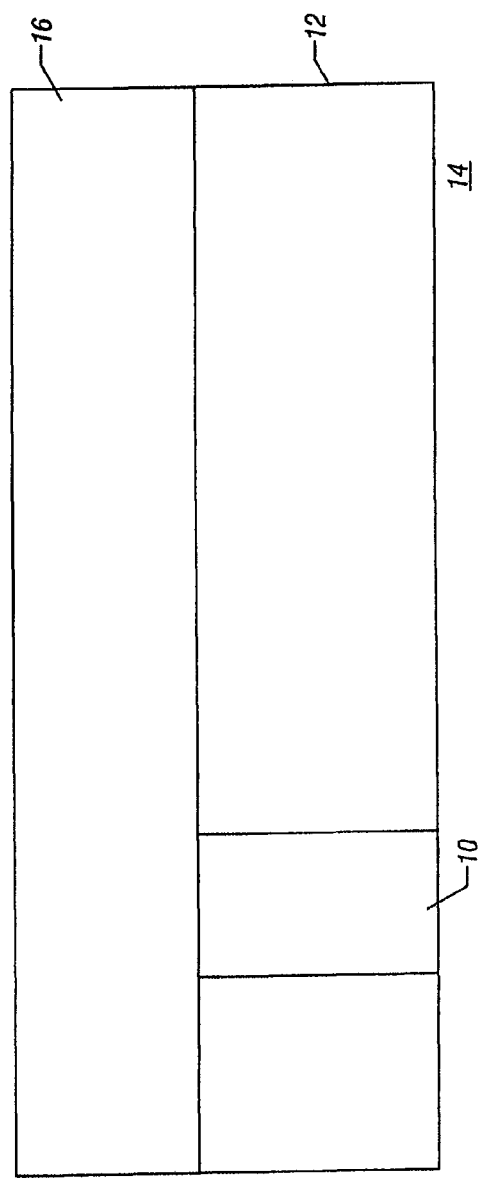

LATERAL PHASE CHANGE MEMORY

BACKGROUND OF THE INVENTION

1. Field of the Invention

The present invention relates generally to semiconductor memories and, in particular, to a lateral phase change memory.

2. Description of the Related Art

Phase change memory devices use phase change materials, i.e., materials that may be electrically switched between a generally amorphous and a generally crystalline state, as an electronic memory. One type of memory element utilizes a phase change material that is electrically switched between generally amorphous and generally crystalline local orders or between different detectable states of local order across the entire spectrum between completely amorphous and completely crystalline states.

Typical materials suitable for such an application include various chalcogenide elements. The state of the phase change materials is also non-volatile, absent application of excess temperatures, such as those in excess of 150° C. for extended times. When the memory is set in either a crystalline, semi-crystalline, amorphous, or semi-amorphous state representing a resistance value, that value is retained until reprogrammed, even if power is removed. This is because the programmed value represents a phase or physical state of the material (e.g., crystalline or amorphous).

Prior art phase change memories have a vertical structure including a stack of an upper electrode, a phase change material region, and a lower electrode. Because of the presence of the intervening phase change material region and the fact that the upper electrode is formed on the phase change material region, the electrodes are made of different materials. More particularly, the top electrode is made using low temperatures to avoid adverse effects on the phase change material region when the upper electrode is deposited. However, the use of different materials for the upper and lower electrodes may result in various disadvantages.

Therefore, there is a need for better phase change memories.

BRIEF SUMMARY OF THE INVENTION

One embodiment of the invention provides a phase change memory having a structure that allows, if desired, to form electrodes of the same material.

One embodiment of the invention is a method of making a phase change memory. The method includes: forming first and second spaced electrodes having substantially co-planar surfaces; and forming a phase change material region on said surfaces.

Another embodiment of the invention is a phase change memory that includes: a phase change material region having a substantially planar surface; and a pair of spaced electrodes that are arranged in an abutting position with respect to said surface.

BRIEF DESCRIPTION OF THE SEVERAL VIEWS OF THE DRAWINGS

For the understanding of the present invention, a preferred embodiment is now described, purely as a non-limitative example, with reference to the enclosed drawings, wherein:

FIGS. 2-11 are enlarged, cross-sectional views of the embodiment shown in FIG. 1 at subsequent stages of manufacture;

DETAILED DESCRIPTION OF THE INVENTION

Figure 1:
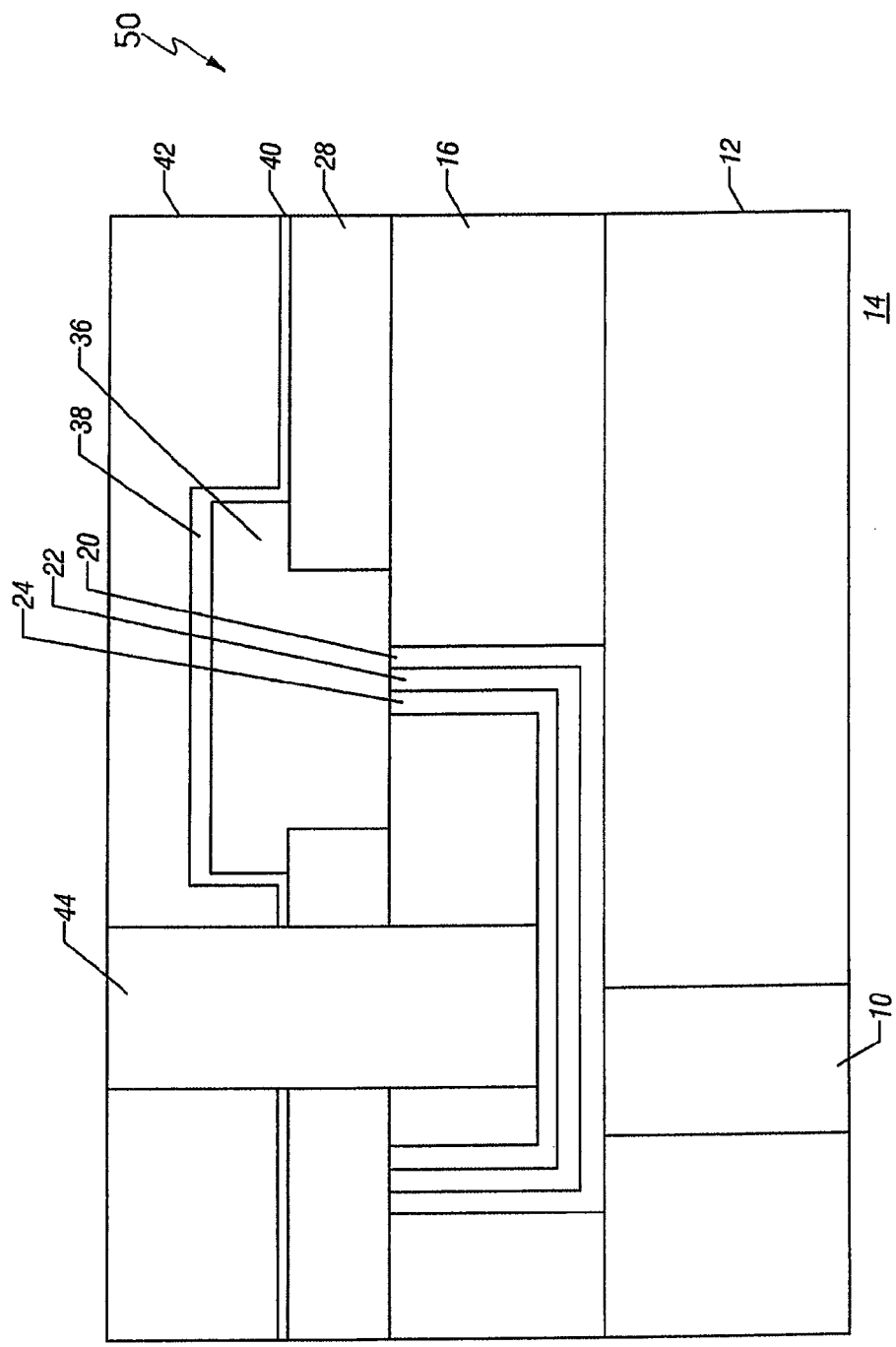
FIG. 1 is an enlarged, cross-sectional view through one embodiment of the present invention.

Referring to FIG. 1, a lateral phase change memory 50 includes a pair of electrodes 20 and 24 spaced by an intervening insulator 22. The electrodes 20 and 24 and the intervening insulator 22 are cup-shaped or U-shaped. The spacing between the electrodes 20 and 24 is determined by the thickness of the insulator 22, which can be precisely controlled and may be very thin. As a result, the threshold voltage of the device 50 may be relatively low.

An upper contact 44 makes contact to the upper electrode 24 and a lower contact 10 makes contact to the lower electrode 20. A phase change material region 36 is completely encapsulated in insulators 38, 42, 40, 28 and 16. An oxide layer 12 underlies the insulator 16.

In FIG. 1, the electrodes 20 and 24 are made symmetrically. In particular, they may be made of the same material. Here, both electrodes 20, 24 are deposited before the phase change material 36 deposition and, thus, the electrodes 20, 24 can be prepared at an elevated temperature, which will stabilize their behaviors. Furthermore, advantageously, the phase change material 36 can be etched and encapsulated without consideration of the top contact, thus, reducing processing before encapsulation. Moreover, advantageously, the region of programmed material (here the phase change material region 36) may be completed surrounded by thermal insulators, except for the electrodes 20, 24, which can be a sidewall with limited contact and which may yield significantly lower power consuming memory elements. Still another advantage is that both electrodes 20, 24 may contribute equally to the heating of the phase change material 36, increasing the efficiency of heating.

Referring to FIG. 2, initially, an oxide layer 12 (or other insulating layer) is deposited over a semiconductor substrate 14. Using conventional via formation techniques, a vertical contact 10 is formed, extending through the layer 12, down to the substrate 14. For example, the contact 10 is a tungsten contact. It may make contact to buried contacts (not shown) formed in the substrate 14. As another option, the contact 10 may connect to metal address lines (not shown) which are formed as part of the substrate 14.

Figure 4:
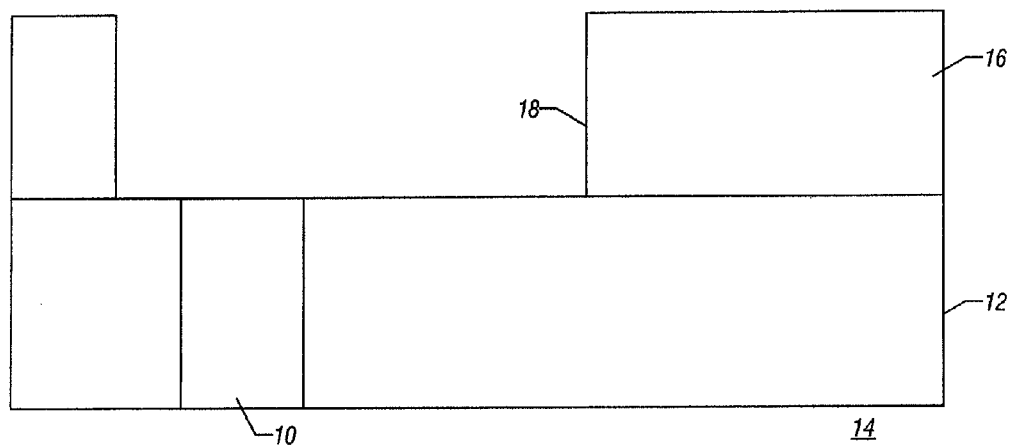

Referring to FIG. 3, another oxide layer 16 (or other insulating layer) is deposited over the layer 12 and the contact 10. Then, as shown in FIG. 4, an opening 18 is formed through the layer 16 down to the layer 12 and the contact 10.

Figure 5:
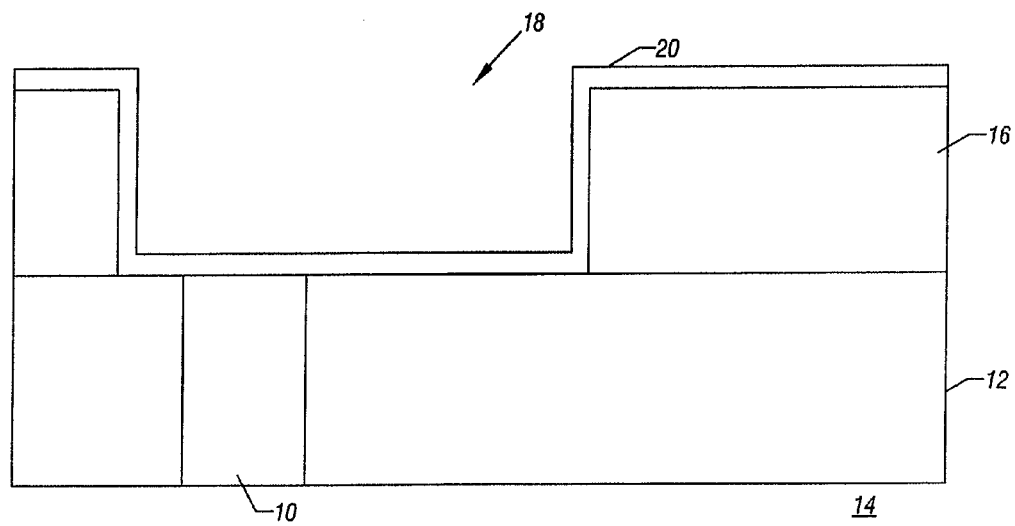

The lower electrode 20 is then deposited into the opening 18 and over the layer 16 as shown in FIG. 5. The electrode 20 may, for example, be formed of a thin film material having a thickness ranging from about 20 to about 2000 Angstroms. For example, the thickness of the electrode 20 is about 50 Angstroms. Suitable materials for the electrode 20 include a thin film of titanium, titanium nitride, titanium tungsten, carbon, silicon carbide, titanium aluminum nitride, titanium silicon nitride, polycrystalline silicon, tantalum nitride, some combination of these films, or other suitable conductors or resistive conductors.

Figure 6:
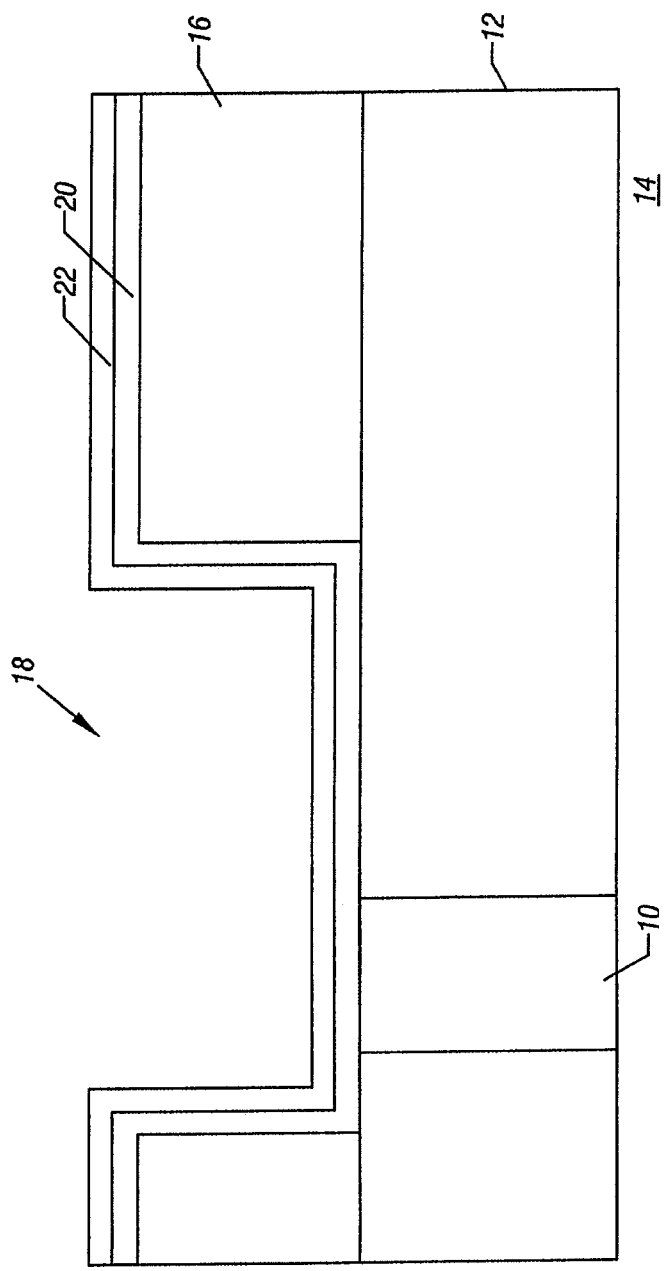

Turning to FIG. 6, an insulator 22 is then deposited over the lower electrode 20. The insulator 22 may be nitride. The thickness of the insulator 22 may be less than 500 Angstroms, for example about 200 Angstroms. Other insulating materials and thicknesses may be utilized as well.

Figure 7:
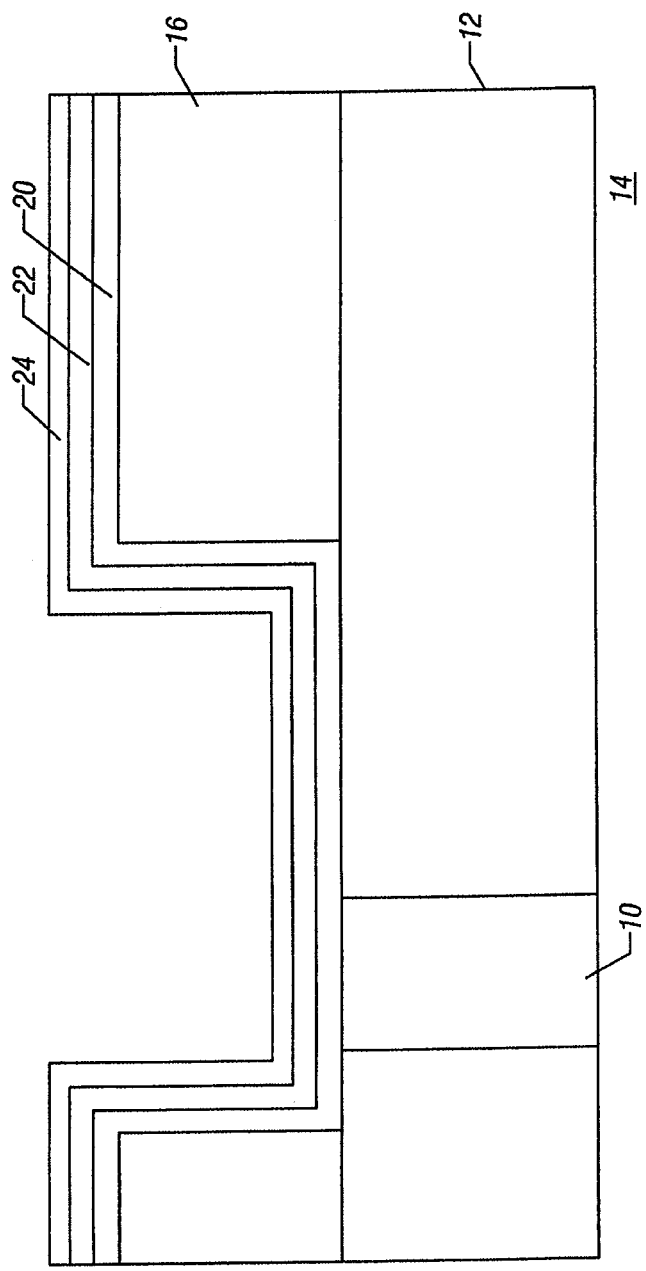

Then, referring to FIG. 7, the upper electrode 24 is deposited. The upper electrode 24 may be made of the same material as the lower electrode 20.

Figure 8:
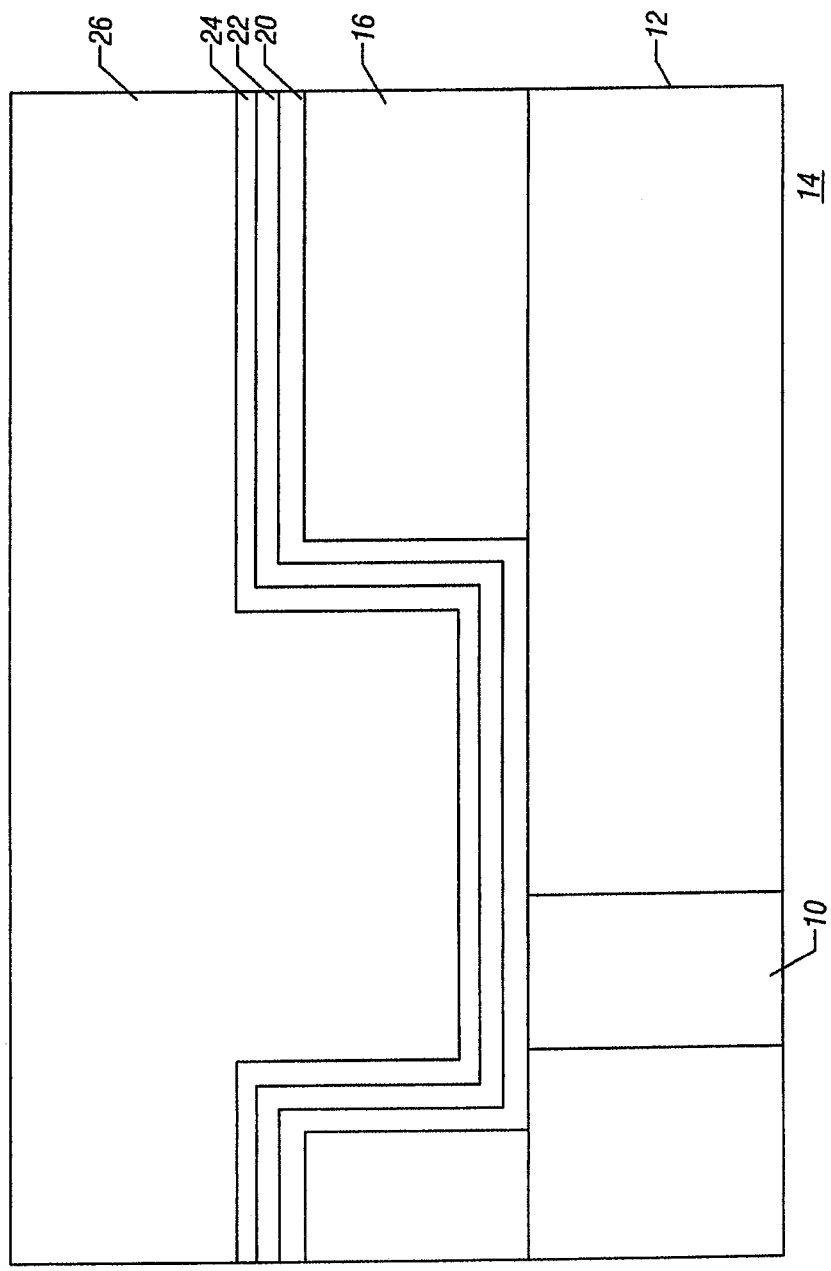

Referring to FIG. 8, a high density plasma (HDP) oxide 26 is then deposited over the entire structure. The oxide 26 is subjected to chemical mechanical planarization (CMP) as shown in FIG. 9.

Figure 9:
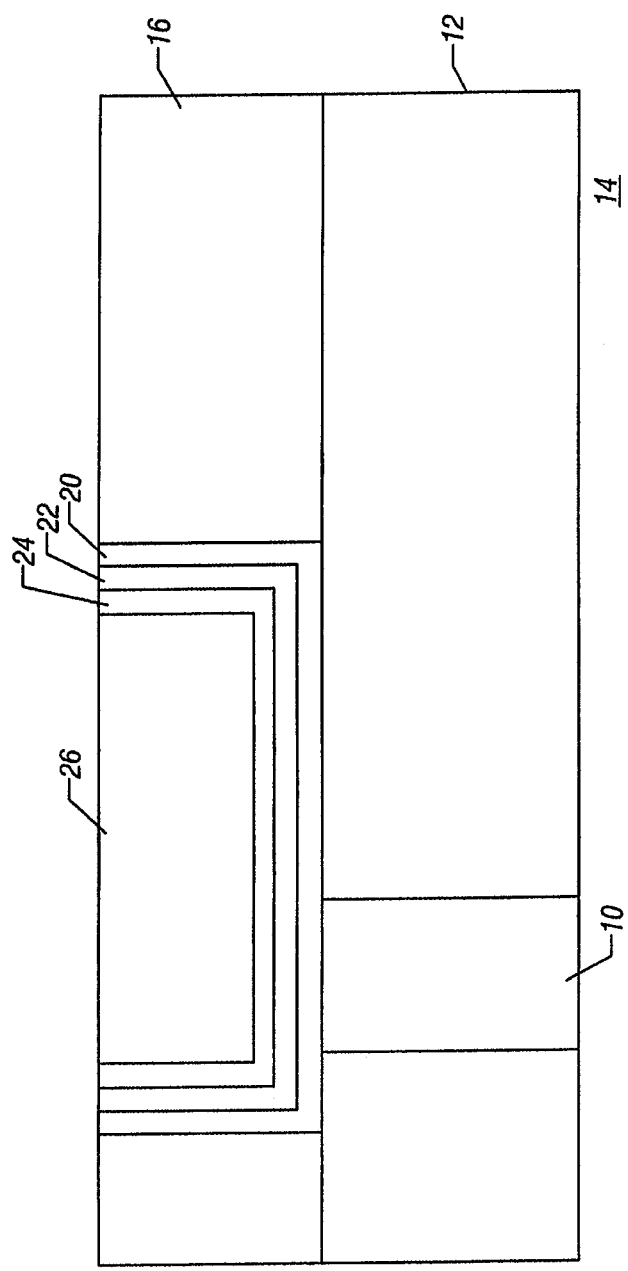
Figure 10:
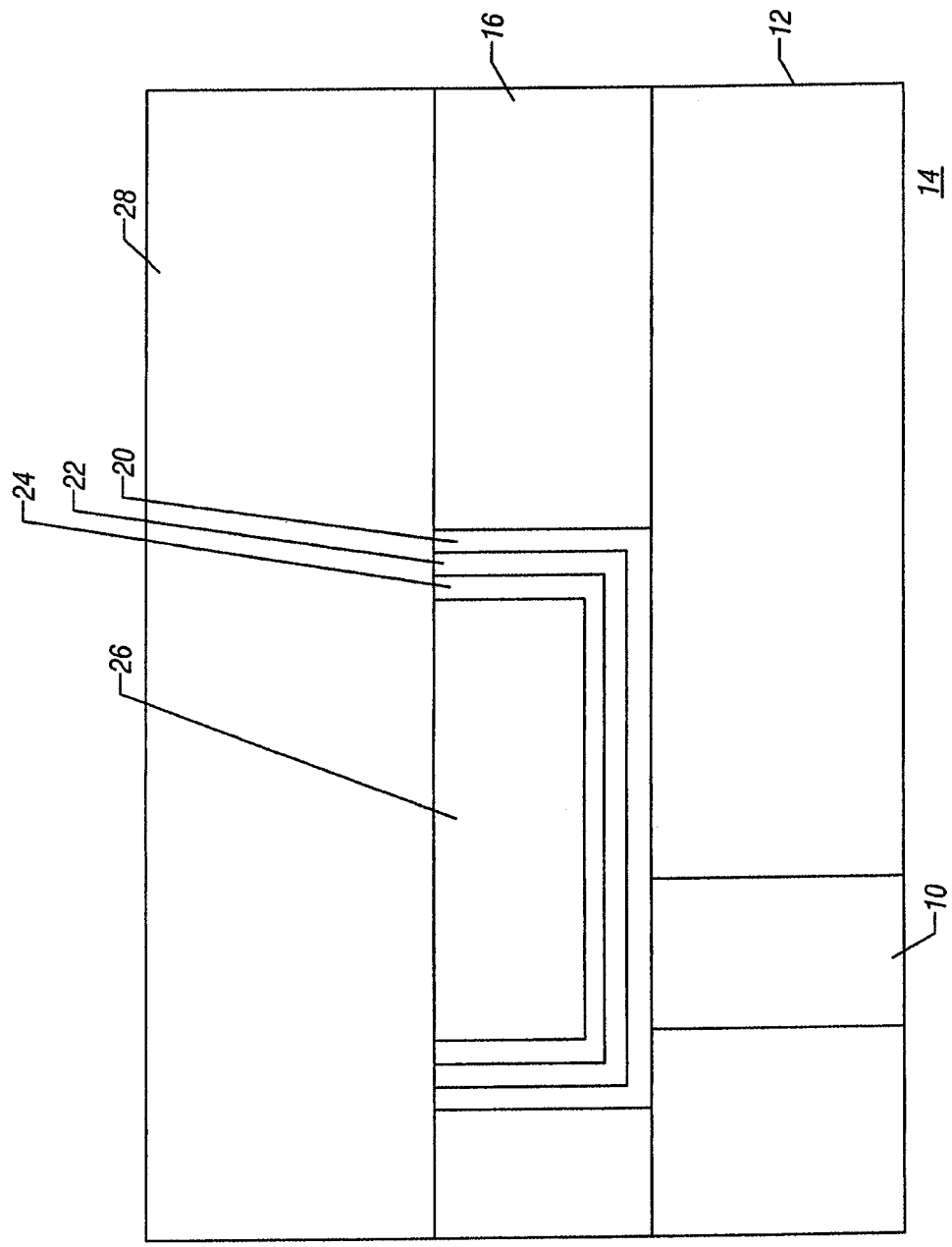
Figure 11:
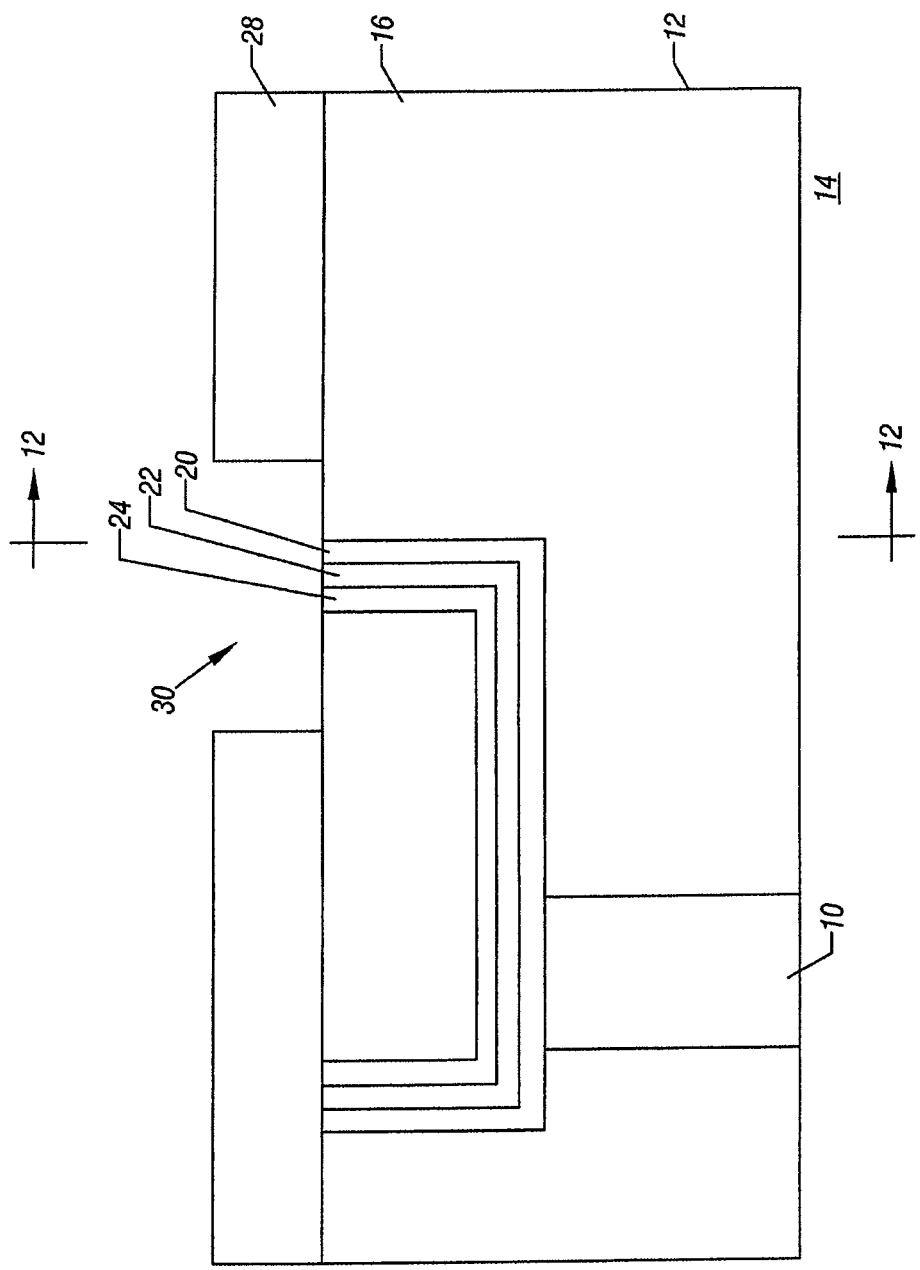
Figure 12:
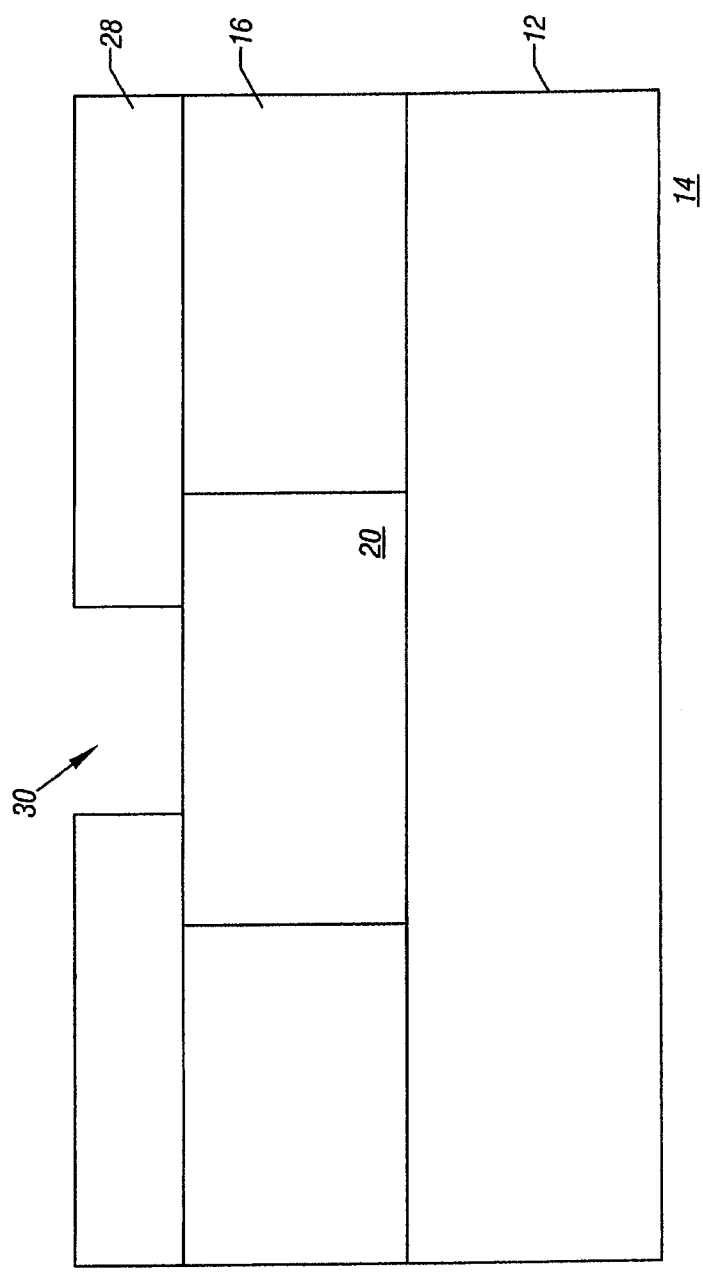
FIGS. 12-17 are cross-sectional views, taken along line 12-12 of FIG. 11, at subsequent stages of manufacture.

Then, another oxide layer 28 is deposited over the planarized structure of FIG. 9, as shown in FIG. 10. A microtrench 30 is then etched into the layer 28 (whose thickness is reduced by the microtrenching process), as shown in FIG. 11. As shown in FIG. 12, the lower electrode 20 and, particularly, the vertical portion thereof is situated below the microtrench 30.

Figure 13:
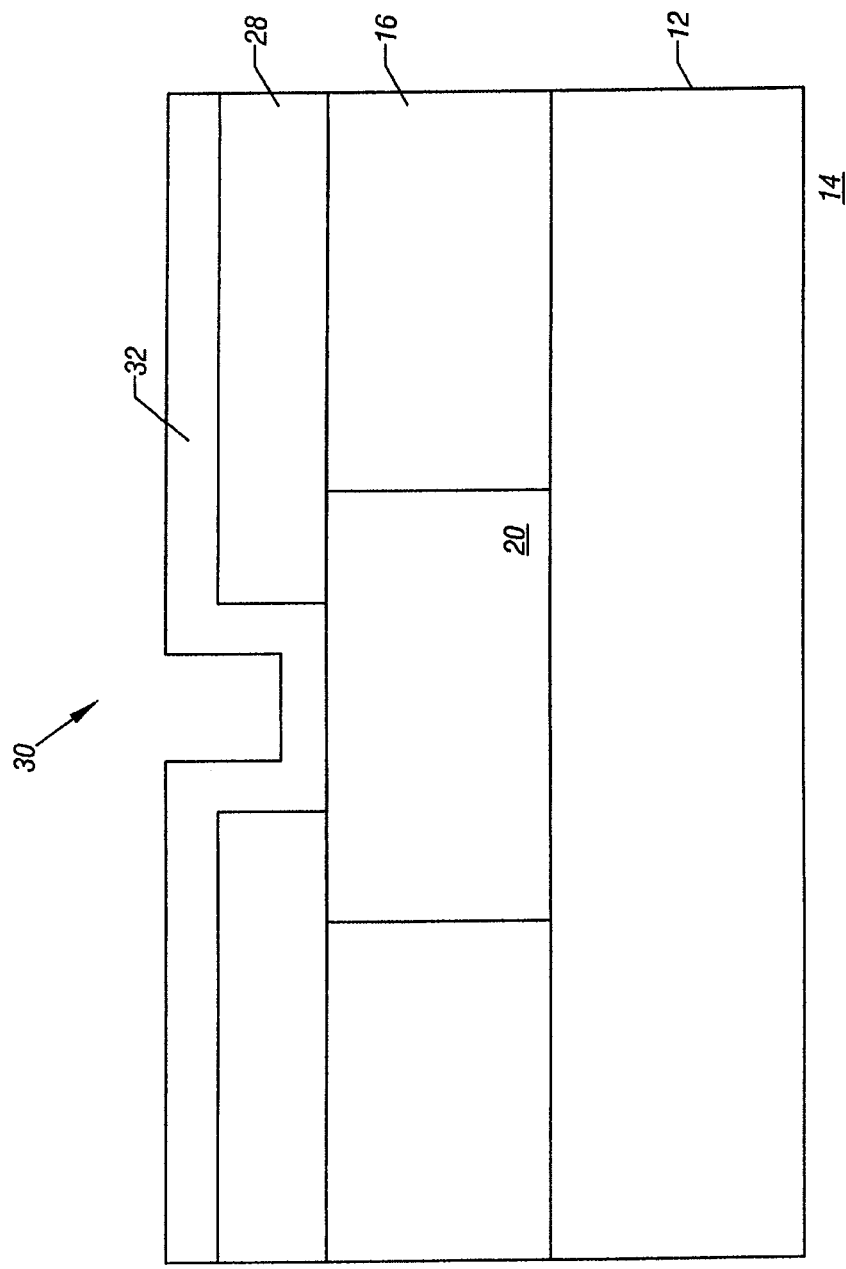
Figure 14:
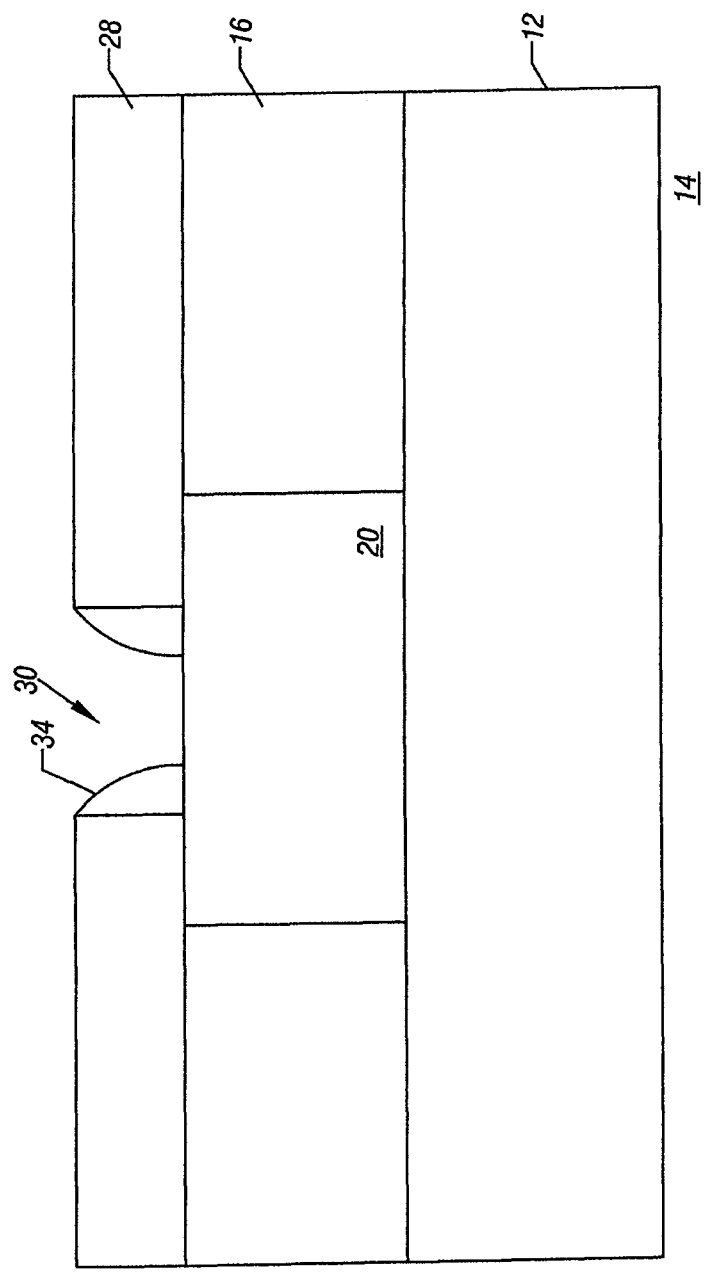

As shown in FIG. 13, a spacer layer 32 of any suitable spacer material is deposited. Then, as shown in FIG. 14, sidewall spacers 34 are defined using an anisotropic etching process, for example.

Figure 15:
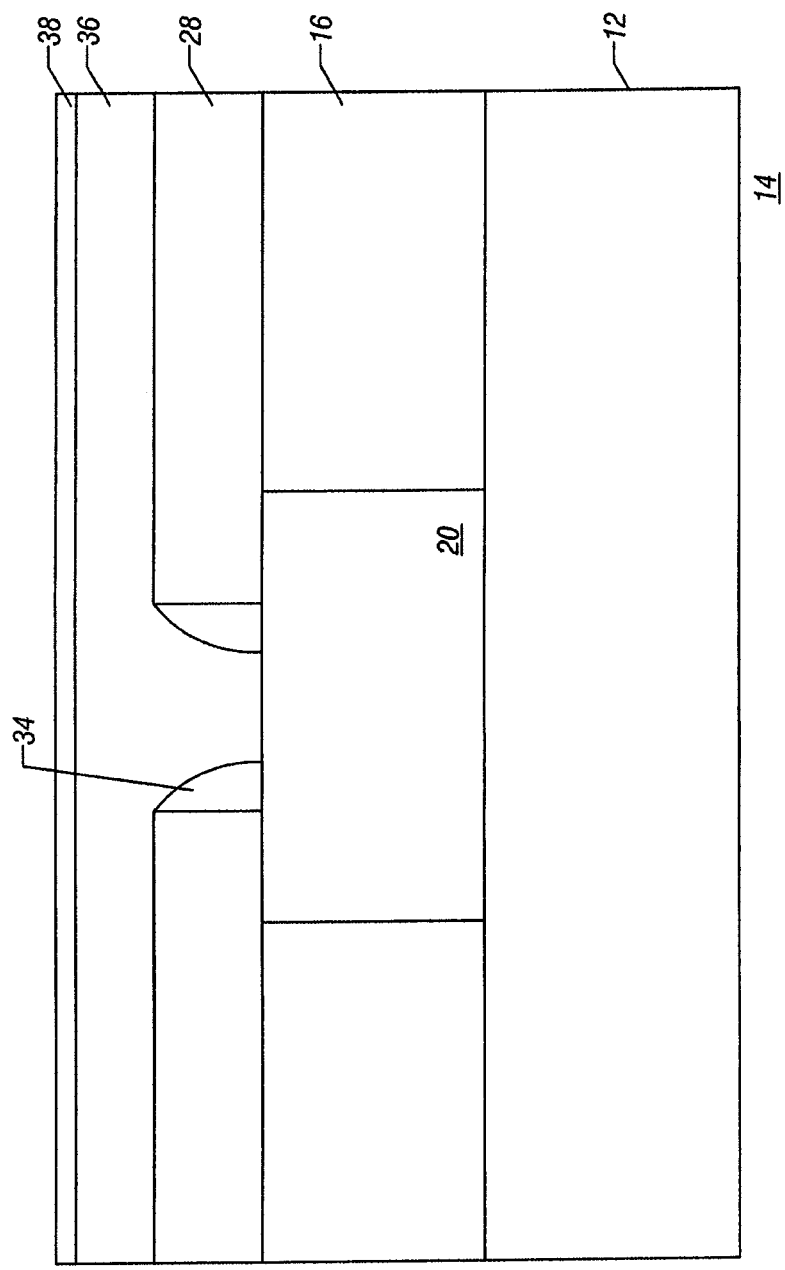

As shown in FIG. 15, the phase change material 36 is deposited so as to fill the microtrench 30 and to overlie the layer 28. Thus, the deposition of the phase change material 36 advantageously occurs after the deposition of the electrodes 20 and 24. As a result, higher temperature deposition processes may be used to form the electrodes 20 and 24. In the discussed embodiment, the phase change material 36 is in contact with the electrodes 20, 24; alternatively, the phase change material 36 may be in electrical connection with the electrodes 20, 24 through a conductive intervening layer (not shown).

In the considered embodiment, the phase change material 36 includes a chalcogenide material. A chalcogenide material is a material that includes at least one element from column VI of the periodic table or a material that includes one or more of the chalcogen elements, e.g., any of the elements of tellurium, sulfur, or selenium. Chalcogenide materials are non-volatile memory materials that may be used to store information that is retained even after the electrical power is removed.

In particular, the phase change material may be a chalcogenide element composition from the class of tellurium-germanium-antimony ($Te_xGe_ySb_z$) material or a GeSbTe alloy, such as 2,2,5, although the scope of the present invention is not limited to just these materials.

Figure 16:
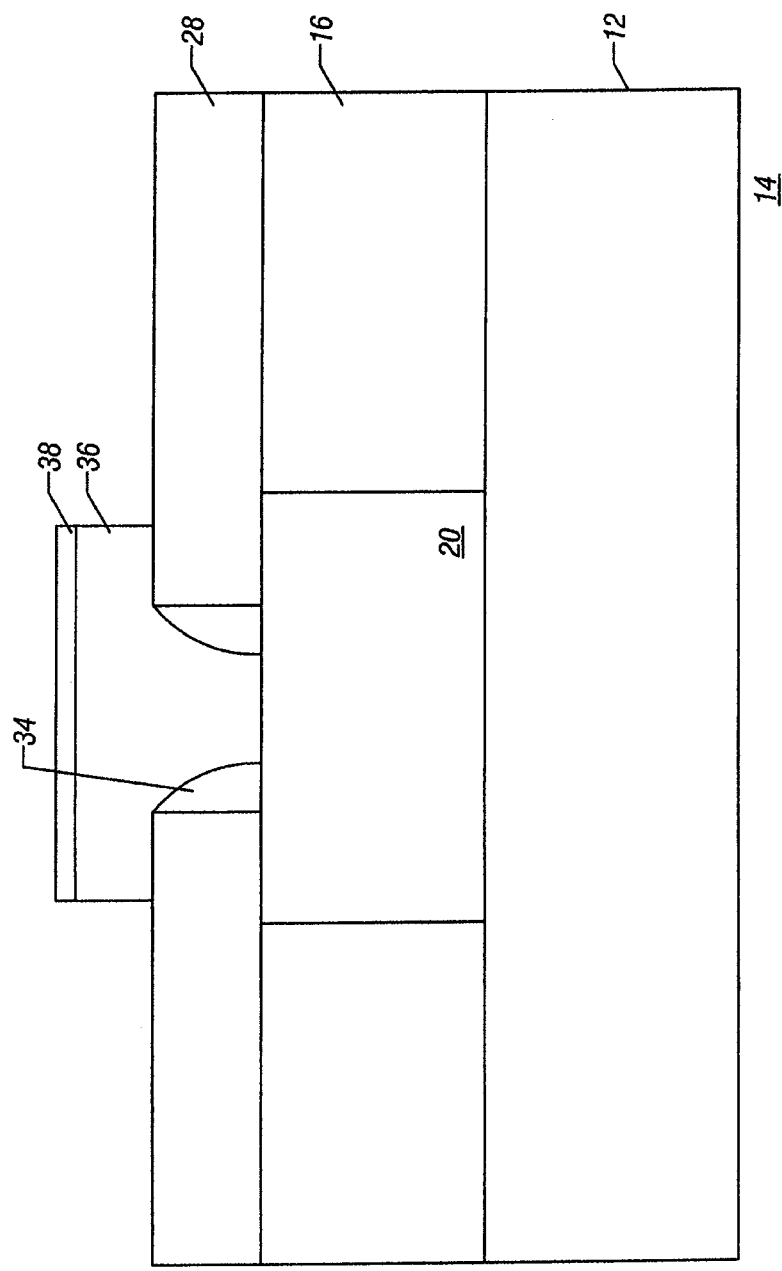

A first cap layer 38 is formed thereover. The first cap layer 38 is, e.g., composed of nitrogen-doped titanium aluminum. The first cap layer 38 functions to encapsulate the phase change material 36 to prevent poisoning or sublimation as a result of ensuing processing. As shown in FIG. 16, the first cap layer 38 and phase change material 36 are then patterned and etched.

Figure 17:
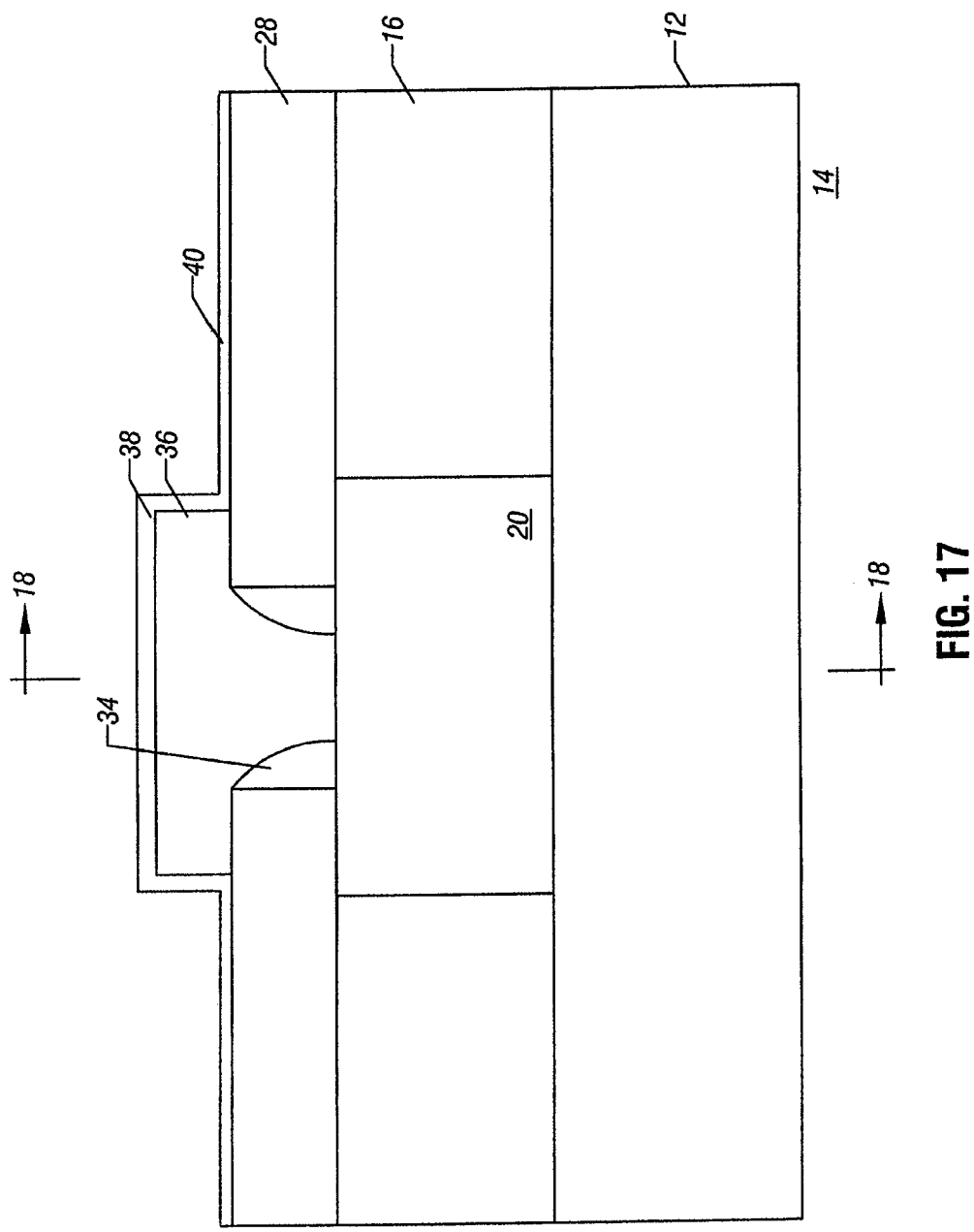
Figure 18:
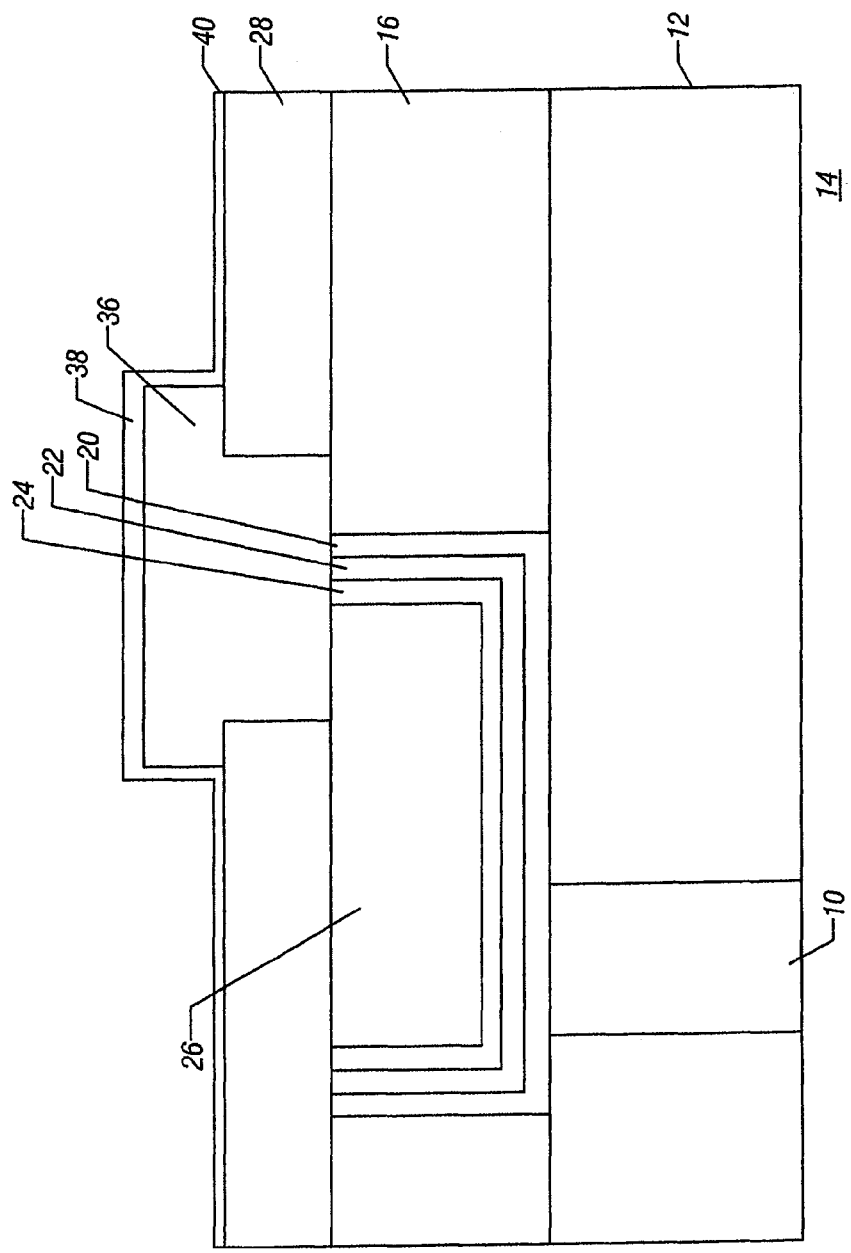
FIGS. 18-19 are cross-sectional views analogous to FIGS. 2-11, in final stages of manufacture.

Referring to FIGS. 17 and 18, a second cap layer 40 is then deposited over the first cap layer 38 and over the layer 28. In the present embodiment, the second cap layer 40 is formed of the same material as the first cap layer 38, thus, on top of the first cap layer 38 only reference number 38 is used.

Figure 19:
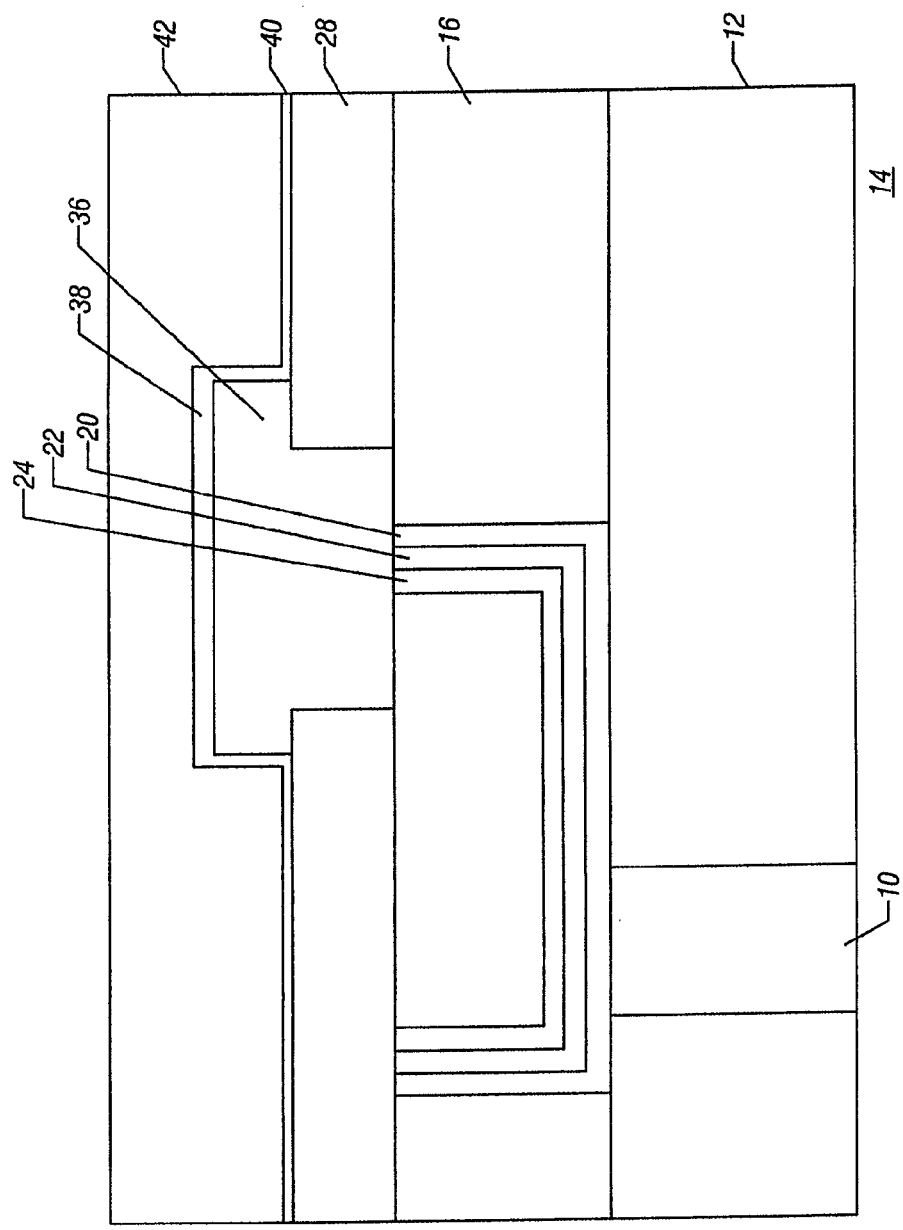

Referring to FIG. 19, an HDP oxide 42 is deposited; thereafter the entire structure is subjected to chemical mechanical planarization and the upper contact 44 is formed using conventional via formation techniques, thereby obtaining the structure of FIG. 1. The contact 44 may be formed of the same material as the contact 10.

Programming of phase change material 36 to alter the state or phase of the material may be accomplished by applying voltage potentials to electrodes 20 and 24, thereby generating a voltage potential across the material 36. When the voltage potential is greater than the threshold voltage of the device 50, then an electrical current flows through memory material 36 in response to the applied voltage potential, and results in heating memory material 36.

This heating alters the memory state or phase of memory material 36 and thus the electrical characteristic of memory material 36, e.g., the resistance of the material is altered by altering the phase of the memory material 36. Thus, memory material 36 may also be referred to as a programmable resistive material.

In the "reset" state, memory material 36 is in an amorphous or semi-amorphous state and in the "set" state, memory material 36 is in a crystalline or semi-crystalline state. The resistance of memory material 36 in the amorphous or semi-amorphous state is greater than the resistance of memory material 36 in the crystalline or semi-crystalline state. It is to be appreciated that the association of reset and set with amorphous and crystalline states, respectively, is a convention and that at least an opposite convention may be adopted.

Using electrical current, memory material 36 may be heated to a relatively higher temperature to amorphosize memory material 36 and "reset" memory material 36 (e.g., program memory material 36 to a logic "0" value). Heating the volume of memory material 36 to a relatively lower crystallization temperature crystallizes memory material 36 and "sets" memory material 36 (e.g., programs memory material 36 to a logic "1" value). Various resistances of memory material 36 may be achieved to store information by varying the amount of current flow and duration through the volume of memory material 36.

Figure 20:
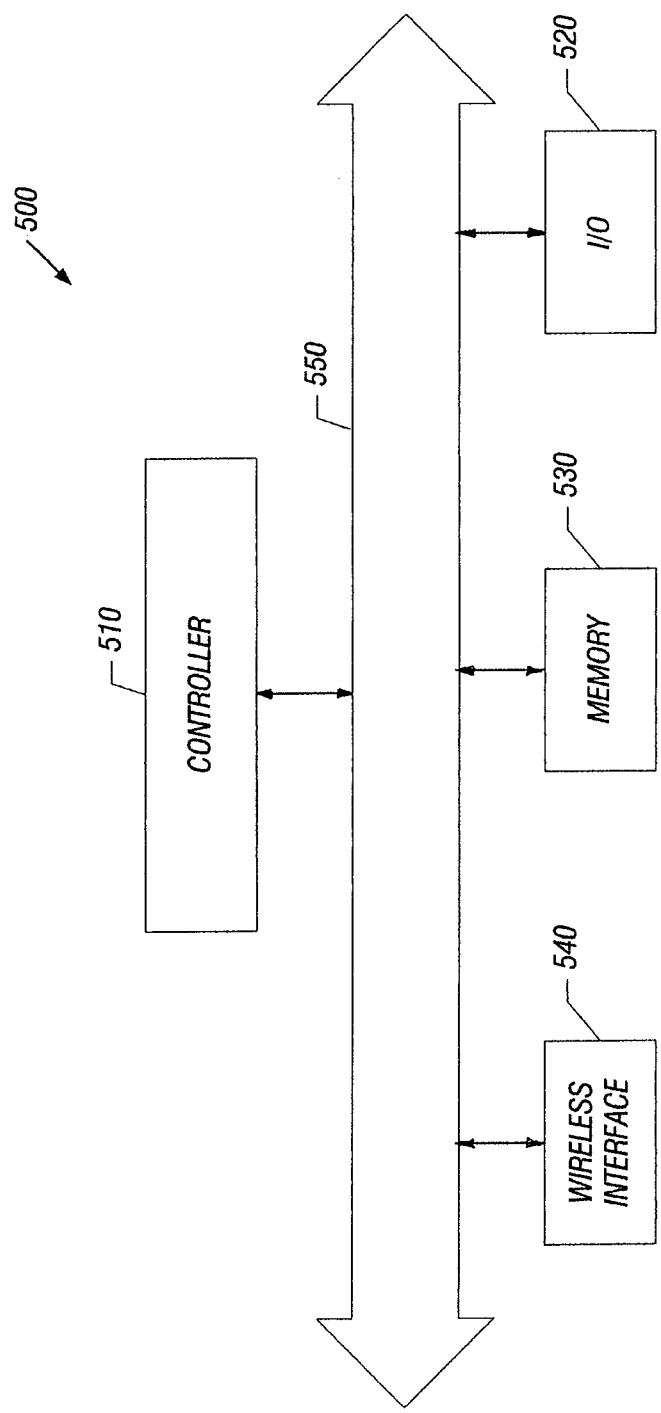
FIG. 20 is a system depiction of one embodiment of the present invention.

Finally, referring to FIG. 20, a system is depicted. System 500 includes a controller 510, an input/output (I/O) device 520 (e.g., a keypad, display), a memory 530, and a wireless interface 540 coupled to each other via a bus 550. It should be noted that the scope of the present invention is not limited to embodiments having all of these components.

Controller 510 may comprise, for example, one or more microprocessors, digital signal processors, microcontrollers, or the like. Memory 530 may be used to store messages transmitted to or by system 500. Memory 530 may also optionally be used to store instructions that are executed by controller 510 during the operation of system 500, and may be used to store user data. Memory 530 may be provided by a memory such as memory 50 discussed herein.

I/O device 520 may be used by a user to generate a message. System 500 uses wireless interface 540 to transmit and receive messages to and from a wireless communication network with a radio frequency (RF) signal. Examples of a wireless interface 540 include an antenna or a wireless transceiver, although the scope of the present invention is not limited in this respect.

Finally, it is clear that numerous variations and modifications may be made to the phase change memory and method described and illustrated herein, all falling within the scope of the invention as defined in the attached claims.

All of the above U.S. patents, U.S. patent application publications, U.S. patent applications, foreign patents, foreign patent applications and non-patent publications referred to in this specification and/or listed in the Application Data Sheet are incorporated herein by reference, in their entirety.

The invention claimed is:
1. A phase change memory cell comprising:
   a phase change material region having a substantially planar surface;

first and second electrodes spaced apart from each other; and an insulating layer between the electrodes, wherein said electrodes and said insulating layer directly contact said surface of the phase change material region and the electrodes are configured to create a current between the electrodes and through the phase change material region.

2. The memory of claim 1, wherein said electrodes are cup-shaped.

3. The memory of claim 1, comprising first and second contacts respectively contacting the first and second electrodes.

4. The memory of claim 3, wherein each electrode includes a first arm extending in a vertical direction and contacting the surface of said phase change material and a second arm extending in a horizontal direction, the second arm of the first electrode contacts the first contact and the second arm of the second electrode contacts the second contact.

5. The memory of claim 1, including a cap material over said phase change material region.

6. The memory of claim 5, wherein said cap material includes nitrogen-doped titanium aluminum.

7. A system comprising:
a controller;
a wireless interface coupled to said controller; and
a phase change memory coupled to said controller and including:
 a phase change material region having a substantially planar surface;
 first and second electrodes spaced apart from each other;
 an insulating layer between the electrodes, wherein said electrodes and said insulating layer directly contact said surface of the phase change material region; and
 first and second contacts respectively contacting the first and second electrodes.

8. The system of claim 7, wherein said insulator has a thickness less than 500 Angstroms.

9. The memory of claim 8, wherein said insulator has a thickness less than 500 Angstroms.

10. The memory of claim 8, wherein said surface of the phase change material region is a bottom surface and said electrodes have respective arm portions that have respective top surfaces that contact the bottom surface of said phase change material region.

11. The system of claim 7, wherein the surface of the phase change material region is a bottom side of the phase change material region and the phase change material region further includes a top side and lateral sides, the memory further including a cap material contacting the top and lateral sides of said phase change material region.

12. The system of claim 11, wherein said cap material includes nitrogen-doped titanium aluminum.

13. The system of claim 7, wherein said surface of the phase change material region is a bottom surface and said electrodes have respective arm portions that have respective top surfaces that contact the bottom surface of said phase change material region.

14. The system of claim 7, wherein each electrode includes a first arm extending in a vertical direction and contacting the surface of said phase change material and a second arm extending in a horizontal direction, the second arm of the first electrode contacts the first contact and the second arm of the second electrode contacts the second contact.

15. A phase change memory, comprising:
a phase change material region having a substantially planar surface;
first and second electrodes spaced apart from each other and contact said surface;
an insulator layer separating said electrodes from each other, contacting said surface, and having a thickness less than 500 Angstroms; and
first and second contacts respectively contacting the first and second electrodes.

16. The memory of claim 15, wherein each electrode includes a first arm extending in a vertical direction and contacting the surface of said phase change material and a second arm extending in a horizontal direction, the second arm of the first electrode contacts the first contact and the second arm of the second electrode contacts the second contact.

17. The memory of claim 15, wherein said surface of the phase change material region is a bottom surface and said electrodes have respective arm portions that have respective top surfaces that contact the bottom surface of said phase change material region.

18. The memory of claim 15, wherein the surface of the phase change material region is a bottom side of the phase change material region and the phase change material region further includes a top side and lateral sides, the memory further including a cap material contacting the top and lateral sides of said phase change material region.

* * * * *